United States Patent
van Gastel

(10) Patent No.: US 7,170,045 B2
(45) Date of Patent: Jan. 30, 2007

(54) APPARATUS HAVING AT LEAST TWO IMAGE RECORDING DEVICES AND ITS METHOD FOR PLACING AT LEAST ONE COMPONENT IN A DESIRED POSITION ON A SUBSTRATE

(75) Inventor: Josephus M. M. van Gastel, AH Eindhoven (NL)

(73) Assignee: Assembléon N.V., Eindhoven (NL)

(*) Notice: Subject to any disclaimer, the term of this patent is extended or adjusted under 35 U.S.C. 154(b) by 136 days.

(21) Appl. No.: 10/516,514

(22) PCT Filed: May 21, 2003

(86) PCT No.: PCT/IB03/02329

§ 371 (c)(1),
(2), (4) Date: Apr. 6, 2005

(87) PCT Pub. No.: WO03/103363

PCT Pub. Date: Dec. 11, 2003

(65) Prior Publication Data

US 2005/0173621 A1    Aug. 11, 2005

(30) Foreign Application Priority Data

Jun. 3, 2002   (EP) .................................. 02077166

(51) Int. Cl.
*H01J 40/14*    (2006.01)

(52) U.S. Cl. ..................... 250/221; 250/208.1; 250/239
(58) Field of Classification Search ................ 250/221, 250/239, 223 R, 208.1, 559.29, 559.3, 559.33; 356/399–401

See application file for complete search history.

(56) References Cited

U.S. PATENT DOCUMENTS 5,633,719 A * 5/1997 Oehlbeck et al. ............ 356/401

FOREIGN PATENT DOCUMENTS

| WO | WO 00/78114 A | 12/2000 |
| WO | WO 01/70001 A | 9/2001 |

* cited by examiner

*Primary Examiner*—Que T. Le
(74) *Attorney, Agent, or Firm*—Foley & Lardner LLP

(57) ABSTRACT

A method and device are provided for placing components in a desired position on at least one substrate. The device includes a movable arm on which at least two image recording device are provided and separated by a predetermined pitch distance. In addition, two placement devices, which are separated by the same pitch distance, are also present on the arm. The spacing between the image recording devices and the placement devices is one pitch distance or a multiple thereof. A picture may be taken of at least one reference element present on a substrate by at least one image recording device, and simultaneously therewith a component may be placed on a substrate by at least one placement device.

13 Claims, 2 Drawing Sheets

APPARATUS HAVING AT LEAST TWO IMAGE RECORDING DEVICES AND ITS METHOD FOR PLACING AT LEAST ONE COMPONENT IN A DESIRED POSITION ON A SUBSTRATE

BACKGROUND

The invention relates to a method suitable for placing at least one component in a desired position on at least one substrate by means of a device. The invention further relates to a device for performing such a method.

In such a method known from international patent application WO 97/38567, an image recording device records an image of a reference element of a substrate, whereupon the desired position of the component with respect to the location of the reference element on the substrate is calculated from the image. At the same time, the position of the component with respect to a placement device is determined by a second image recording device after a component has been picked up from a component feeder device by the placement device. Then the placement device places the component in the desired position on the substrate.

The method of WO97/38567 has the disadvantage that at any given moment either only a component is placed by the placement device or only an image is made of a substrate.

A component placement device is also known from WO97/38567; this placement device is provided with an arm on which a single placement device and a single image recording device are situated, and with a transport belt located below the arm by means of which the substrates are displaced. The component placement device according to the prior art is furthermore provided with a further image recording device.

A disadvantage of the component placement device in WO97/38567 is that it has a limited capacity, i.e., comparatively few components per unit time can be placed by the component placement device.

An object of the invention is to provide a method by which more components can be placed in a given amount of time. Another object of the invention to increase capacity.

SUMMARY

An embodiment of the invention relates to a method suitable for placing at least one component in a desired position on at least one substrate by means of a device. The device is provided with a displaceable arm on which at least one placement device and at least one image recording device are present, such that the image recording device records an image of a reference element located on a substrate, whereupon the location of the desired position relative to the reference element is determined by means of a processor on the basis of the image, and subsequently the component is placed in the desired position on the substrate by the placement device.

The invention further relates to a device that includes, among other possible things, at least an image recording device and at least one placement device for placing a component on a substrate, the image recording device and the placement device being located on an arm.

According to a method according to the invention, an arm is provided with at least two image recording devices situated at a certain pitch distance from each other and with at least two placement devices situated at the same pitch distance from one another, the image recording devices and placement devices being distant from one another by one pitch distance or a multiple thereof, such that at least one image recording device records an image of at least one reference element located on a substrate while at the same time at least one placement device places a component on a substrate. As an image may be taken while a component is placed, components can be placed successively on the substrates more quickly. It is possible to use two image recording devices and two placement devices or more than two, with the result that even more components can be placed per unit time.

According to another embodiment of the method according to the invention, the image recording devices may take images simultaneously, while at the same time the placement devices may place components simultaneously. An advantage of this efficient method is that more components are placed per unit time, i.e., capacity is increased.

According to another embodiment of the method according to the invention, four substrates may be situated at one and the same pitch distance from one another, with the image recording devices taking images of two substrates simultaneously, while at the same time the placement devices place components simultaneously on the other two substrates. In this method, the pitch of the substrate may be equal to the pitch of the image recording devices and the placement devices. An advantage of this embodiment is that the method optimally utilizes the device, i.e., comparatively more components per unit time may be placed by means of this method.

According to another embodiment of the method according to the invention, each image recording device may cooperate with an associated placement device, such that first a first image recording device may take an image while at the same time the associated placement device may place a component, whereupon the second image recording device may take an image while at the same time the associated second placement device may place a component. This method may be suitable for placing components on substrates that are at a distance from one another greater than the pitch distance between the placement devices and image recording devices.

According to another embodiment of the method according to the invention, the placement devices may pick up two components simultaneously from a component feeder device. Components may thus be picked up by the placement devices in an efficient manner.

According to another embodiment of the method according to the invention, the substrate may be located on a positioning table that is controlled by the processor in the plane of the substrate, while the component may be placed in the desired position on the substrate by the placement device. An advantage of such a method is that components can still be placed simultaneously on the substrates if there is a slight deviation between substrates after a displacement of a substrate.

According to another embodiment of the method according to the invention, the placement devices may be displaceable in the plane of the substrate independently of one another. It is possible also in such a method to correct deviations in orientation between two substrates, so that two components may be placed in the correct positions on two, not identically oriented substrates by the placement devices.

According to a device according to the invention, an arm may be provided with at least two image recording devices situated at a certain pitch distance from each other and with at least two placement devices situated at the same pitch distance from one another, the image recording devices and placement devices being distant from one another by one pitch distance or a multiple thereof. An advantage of such a configuration is that the capacity of the device may be comparatively great because at least two image recording devices can take a same number of images simultaneously per unit time and at the same time at least two placement devices can place a same number of components per unit time.

According to an embodiment of the device according to the invention, the device may further be provided with at least two fluxing devices that have the same pitch distance as the placement devices. An advantage of this is that several components may be fluxed simultaneously. The result is that the time required for fluxing may be comparatively short, whereby the capacity of the device may further be improved.

According to another embodiment of the device according to the invention, the device may be provided with at least two further image recording devices that have the same pitch distance to one another as the placement devices. The two further image recording devices may be capable of determining the positions of the components on the placement devices simultaneously. An advantage of this is that the time required for determining the positions of components on the placement devices may be comparatively short, so that the capacity of the device according to the invention may be comparatively great.

According to another embodiment of the device according to the invention, the image recording devices and the placement devices may be situated in one line, such that the two image recording devices are situated next to one another and the two placement devices are situated at one side of the image recording devices. As a result, the construction and the control of the device is comparatively simple.

It is to be understood that both the foregoing general description and the following detailed description are exemplary and explanatory only, and are not restrictive of the invention as claimed.

BRIEF DESCRIPTION OF THE DRAWINGS

These and other features, aspects, and advantages of the present invention will become apparent from the following description, appended claims, and the accompanying exemplary embodiments shown in the drawings, which are briefly described below.

DETAILED DESCRIPTION

Figure 1:
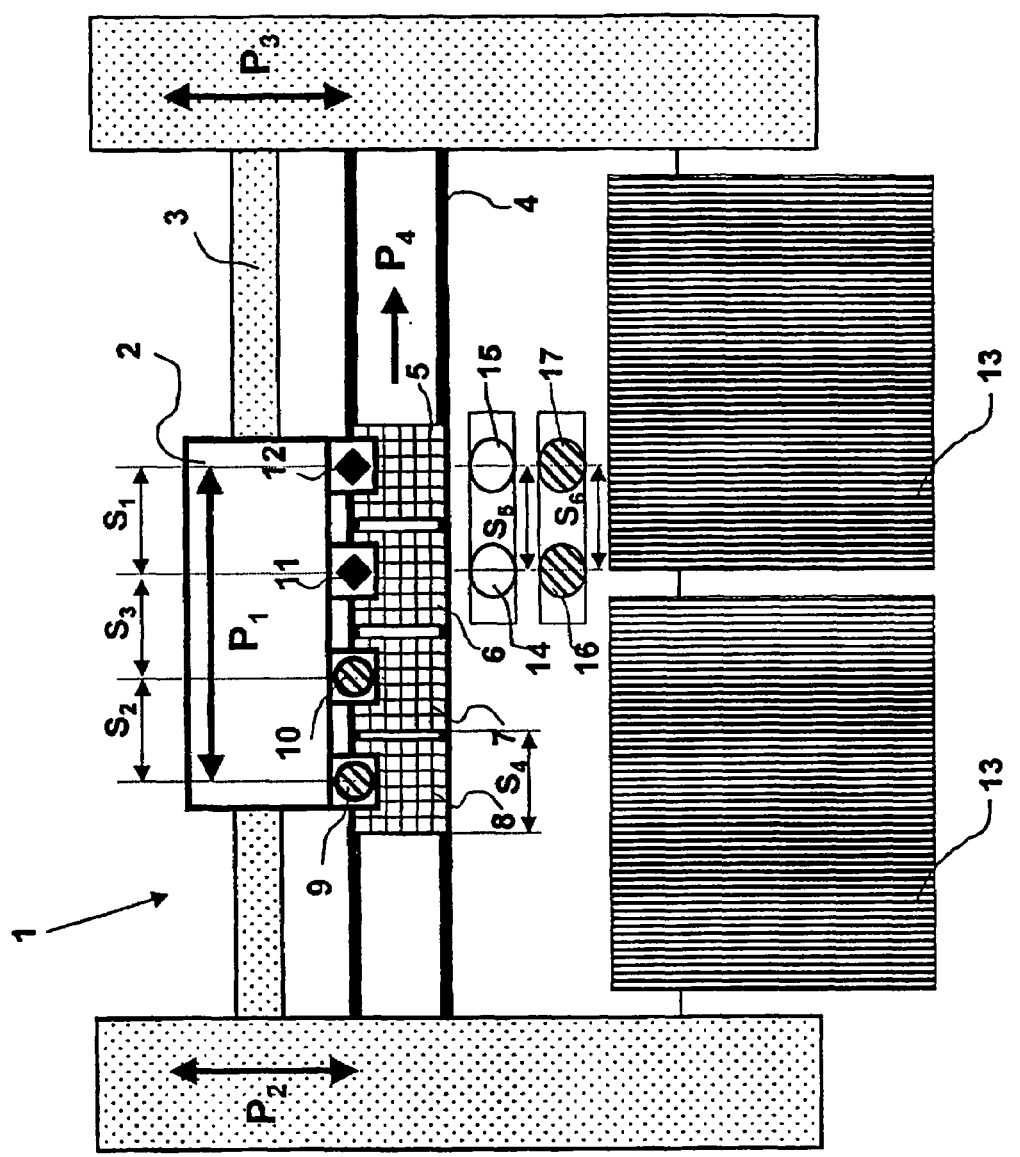
FIG. 1 is a diagrammatic plan view of an embodiment of a device according to the invention.

Corresponding components have been given the same reference numerals in the Figures.

FIG. 1 shows a device 1 that is provided with an arm 2 that is displaceable over a guide 3 by means of a servomotor in and opposite to a direction indicated by arrow P1. The guide 3 is displaceable by means of two servomotors in and opposite to the directions indicated by arrows P2 and P3. The directions indicated by the arrows P2 and P3 are parallel to one another and transverse to the direction indicated by the arrow P1. The arm 2 can be accurately aligned as a result of this because the ends of the guide 3 can be displaced by two separate servomotors in and opposite to the directions indicated by the arrows P2 and P3. Two image recording devices 9, 10 and two placement devices 11, 12 are fastened to the arm 2. The placement devices 11, 12 have a pitch distance $S_1$ to one another, while the image recording devices 9, 10 have the same mutual pitch distance $S_2$. The pitch distance $S_3$ between the placement device 11 and the image recording device 10 is equal to the pitch distances $S_1$, $S_2$.

A transport device 4 by means of which substrates 5, 6, 7, 8 are displaceable in the direction indicated by arrow P4 is situated below the arm 2. The substrates 5, 6, 7, 8 have mutual pitch distances $S_4$ which is equal to the pitch $S_1$, $S_2$, $S_3$. The device 1 is further provided with a component feeder device 13 from which components can be taken by the placement devices 11, 12. Two fluxing devices 14, 15 and two further image recording devices 16, 17 are situated between the component feeder device 13 and the transport device 4. The two fluxing devices 14, 15 have a pitch distance $S_5$, and the two further image recording devices 16, 17 have a pitch distance $S_6$. All pitch distances $S_1$, $S_2$, $S_3$, $S_4$, $S_5$, and $S_6$ in FIG. 1 are identical.

The method of the device 1 will be explained in more detail with reference to FIG. 1.

The initial situation is one in which the transport device (also referred to as a "belt") 4 has moved substrates 5, 6, 7, 8 into the positions shown in FIG. 1. The positions of reference elements (not shown) present on the substrates 5, 6 have already been determined from images recorded by the image recording devices 9, 10.

Subsequently, the arm 2 with the placement devices 11, 12 fastened thereto is displaced along the guide 3 in or opposite to the direction indicated by the arrow P1, while at the same time the guide 3 is displaced in or opposite to the directions indicated by the arrows P2, P3 until the placement devices 11, 12 are situated above the component feeder device 13. As the ends of the guide 3 are to a certain extent separately displaceable in the directions indicated by the arrows P2, P3, it is possible to ensure that the guide 3 will always extend parallel to the transport belt 4.

Components are picked up in the component feeder device 13 by the placement devices 11, 12. Preferably, the components to be picked up have a pitch that corresponds to the pitch $S_1$ between the placement devices 11, 12, so that the components can be picked up simultaneously, for example by means of pipettes (not shown) present in the placement devices 11, 12. Then the placement devices 11, 12 may be displaced by the arm to a position situated above the two further image recording devices 16, 17, where the two further image recording devices 16, 17 simultaneously determine the positions of the picked-up components with respect to the placement devices 11, 12.

The placement devices 11, 12 are subsequently moved by the arm 2 to positions situated above the fluxing devices 14, 15, where flux is applied to the components. Subsequently, the devices 11, 12 are moved to above a desired position on the substrates 5, 6. The desired positions are determined from the locations of the reference elements on the substrates 5, 6 determined previously by the image recording devices 9, 10 and from information relating to the desired positions of the components to be placed with respect to the reference elements.

The moment the placement devices 11, 12 are each above the respective desired position on the substrate 5, 6, the image recording devices 9, 10 are located above respective portions of the substrates 7, 8 on which components are to be placed in a later phase similar to the components being provided at that moment on the substrates 5, 6.

While the components are being placed on the substrates 5, 6 by the placement devices 11, 12, images can be, and are indeed simultaneously taken of the substrates 7, 8 by the two image recording devices 9, 10. The substrates 5, 6, 7, 8 may be displaced over a distance equal to twice the pitch $S_1$ by the transport belt 4 after the components have been placed and the images have been taken. As a result, the substrates 7, 8 will come to lie below the placement devices 11, 12, and at the same time new substrates (not shown) may be positioned below the image recording devices 9, 10. The placement devices 11, 12 may be moved to a position above the component feeder device 13 again during the displacement of the substrates.

Figure 2:
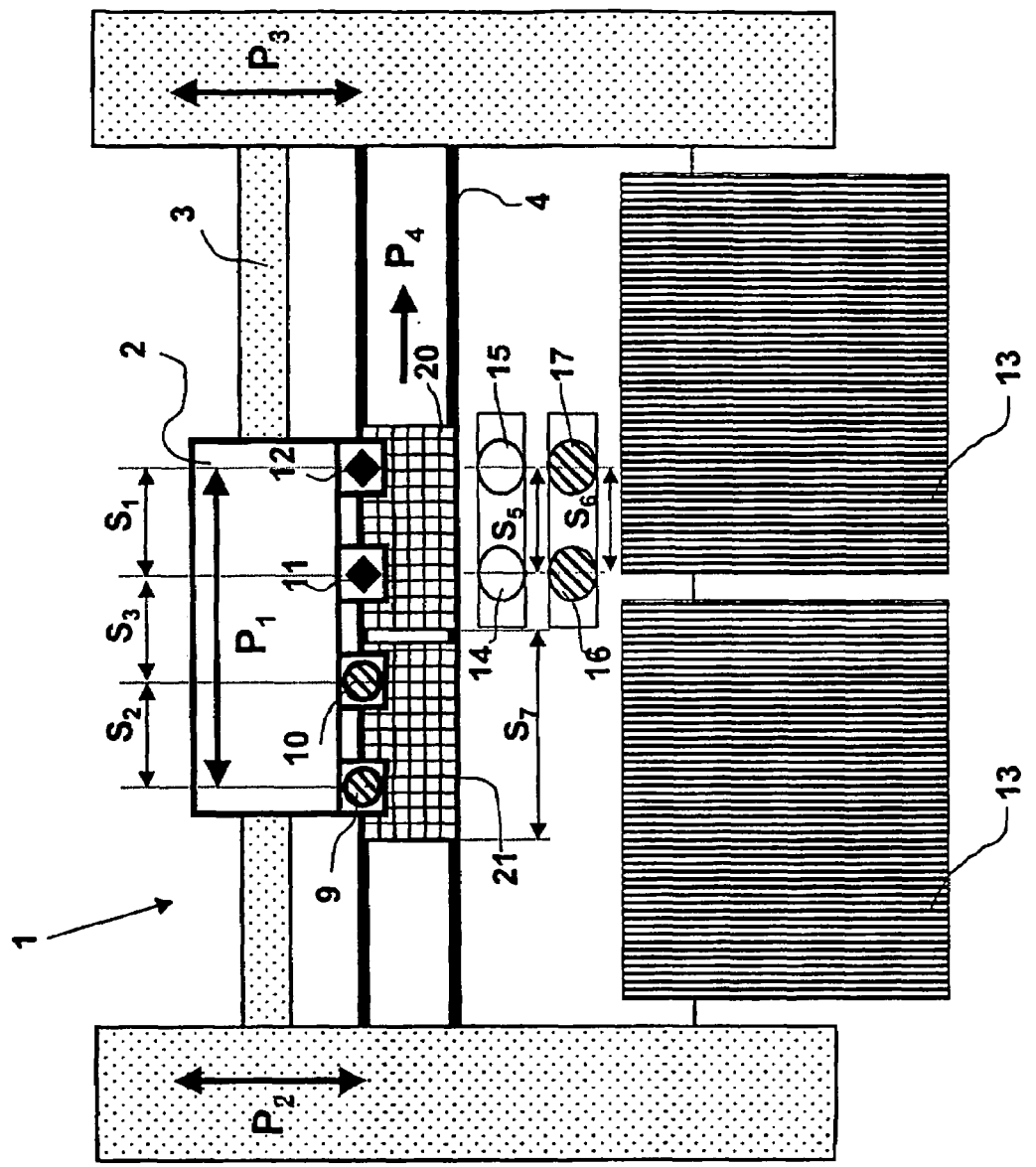
FIG. 2 is a plan view showing an alternative application of the device shown in FIG. 1.

FIG. 2 shows an alternative application of the device according to the invention. Substrates 20, 21 have been displaced to a position below the image recording devices 9, 10 and placement devices 11, 12 in the device 1 by means of the transport belt 4, which substrates 20, 21 have a length greater than the pitch distance $S_1$, $S_2$, $S_3$. In such a case, the substrates on the transport belt 4 are given a pitch that is equal to a multiple of the pitch $S_1$, $S_2$, $S_3$. In the situation shown in FIG. 2, the pitch $S_7$ of the substrates 20, 21 is equal to $2S_1$. The operation of the device 1 in such a situation is as follows.

Components are taken from the component feeder device 13 by the placement devices 11, 12 in the manner previously described. As the two components will be placed on the same substrate, the components may be identical or different. Subsequently, the further image recording devices 16, 17 determine the locations of the components with respect to the placement devices 11, 12 in the manner previously described, and the components are provided with flux by the fluxing devices 14, 15. Then the placement device 12 is moved into a desired position above the substrate 20. As the distance between the image recording device 10 and the placement device 12 is equal to $2S_1$, which distance is equal to the pitch $S_7$ of the substrates 20, 21, the image recording device 10 will be positioned above a position of the substrate 21 on which in a subsequent phase a component is to be placed identical to the one currently being placed on the substrate 20 by the placement device 12. An image can be, and is indeed taken of the substrate 21 by the image recording device 10 while the component is being placed on the substrate 20.

The placement device 11 is subsequently moved into a desired position above the substrate 20. The image recording device 9 will now be above that portion of the substrate 21 where in a later phase a component is to be placed identical to the one currently being placed on the substrate 20 by the placement device 11.

Accordingly, an image can be, and is indeed taken of the substrate 21 by the image recording device 9 while the component is being placed on the substrate 20. After the desired number of components has been placed on the substrate 20, the substrates 20, 21 may be moved by the transport belt 4 in the direction indicated by the arrow P4 over a distance $S_7$, such that the substrate 21 is positioned below the placement devices 11, 12, and a new substrate (not shown) may be positioned below the image recording devices 9, 10, whereupon the entire cycle can be repeated.

If two components having the same mutual pitch as the placement devices 11, 12 are to be placed on a substrate 20, 21, it is possible to place these components simultaneously on the substrate. In such a situation, the image recording devices 9, 10 will take images simultaneously of an adjoining substrate.

It is also possible to place different components on a single substrate before the substrate is displaced in the direction indicated by the arrow P4 by the transport belt 4. If several components are placed on a single substrate, several images of the substrate may first be taken in a prior phase so as to determine the desired position for each component to be placed.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

The invention claimed is:

1. A method suitable for placing at least one component in a desired position on at least one substrate by means of a device, wherein the device comprises a displaceable arm on which at least two placement devices and at least two image recording devices are provided, wherein the at least two image recording devices are separated from each other by a certain pitch distance, wherein the at least two placement devices are separated from each other by substantially the same pitch distance, wherein said image recording devices and placement devices are separated from each other by one said pitch distance or a multiple thereof, the method comprising the steps of:
  recording, using at least one of the image recording devices, an image of at least one reference element located on a substrate;
  determining, by processing said image, the location of the desired position relative to the reference element;
  placing, using at least one of the placement devices, the component in the desired position on the substrate while the at least one image recording device records the image of at least one reference element located on a substrate.

2. The method according to claim 1, wherein the step of recording comprises:
  recording, using at least two image recording devices, the image of the at least one reference element located on the substrate while
  placing, using the placement device, components on the substrate.

3. The method according to claim 2, wherein four substrates are separated from each other by substantially the same pitch distance, and wherein the method comprises the steps of:
  imaging two of the four substrates with the image recording devices while
  placing two components on the other two substrates using the placement devices.

4. The method according to claim 1, wherein each image recording device cooperates with an associated placement device, and wherein the method comprises the steps of:
  imaging, using a first image recording device, at least one reference element located on a first substrate while the associated placement device places a component on the first substrate; and thereafter
  imaging, using a second image recording device, at least one reference element located on a second substrate while at the same time the associated second placement device places a component on the second substrate.

5. The method according to claim 1, wherein the method comprises:
  picking-up, using the placement devices, two components simultaneously from a component feeder device.

6. The method according to claim 1, wherein the substrate is located on a positioning table, and wherein the method comprises:
controlling the positioning table in the plane of the substrate.

7. The method according to claim 1, wherein the placement devices are independently displaceable in a plane of the substrate.

8. A device comprising:
an arm;
at least two image recording devices positioned on the arm, wherein the image recording devices are separated from each other by a pitch distance; and
at least two placement devices positioned on the arm, wherein the placement devices are configured to place a component on a substrate, and wherein the placement devices are separated from each other by the same pitch distance,
wherein the image recording devices and the placement devices are separated from one another by one pitch distance or a multiple thereof.

9. The device according to claim 8, further comprising:
at least two fluxing devices that are separated by substantially the same pitch distance as the placement devices.

10. The device according to claim 8, further comprising:
at least two additional image recording devices that are separated by substantially the same pitch distance as the placement devices.

11. The device according to any claim 8, wherein the image recording devices and the placement devices are substantially situated in a line.

12. The device according to claim 11, wherein the two image recording devices are positioned next to one another in the line, and wherein the two placement devices are positioned to one side of the image recording devices in the line.

13. The device according to claim 8, wherein one of the placement devices is located on the arm between two image recording devices.

* * * * *